(12) United States Patent
Watanabe

(10) Patent No.: US 7,807,998 B2
(45) Date of Patent: Oct. 5, 2010

(54) EVALUATION PATTERN SUITABLE FOR EVALUATION OF LATERAL HILLOCK FORMATION

(75) Inventor: Takayuki Watanabe, Shiga (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 32 days.

(21) Appl. No.: 12/232,486

(22) Filed: Sep. 18, 2008

(65) Prior Publication Data

US 2009/0079459 A1    Mar. 26, 2009

(30) Foreign Application Priority Data

Sep. 26, 2007    (JP) .............................. 2007-249246

(51) Int. Cl.
  *H01L 23/58* (2006.01)
  *H01L 23/52* (2006.01)
  *G01R 31/02* (2006.01)

(52) U.S. Cl. ........................... 257/48; 324/537; 257/758

(58) Field of Classification Search ....................... None
   See application file for complete search history.

(56) References Cited

U.S. PATENT DOCUMENTS

| | | | |
|---|---|---|---|
| 6,710,449 B2 * | 3/2004 | Hyoto et al. ................. | 257/758 |
| 6,943,129 B2 * | 9/2005 | Hyoto et al. ................. | 257/758 |
| 2003/0049945 A1 * | 3/2003 | Hyoto et al. ................. | 438/926 |
| 2004/0101996 A1 * | 5/2004 | Hyoto et al. ................. | 438/128 |
| 2004/0155316 A1 * | 8/2004 | Saito et al. ................... | 257/536 |
| 2008/0023815 A1 * | 1/2008 | Asai et al. .................... | 257/687 |
| 2008/0038851 A1 * | 2/2008 | Koyama et al. ............. | 324/769 |

FOREIGN PATENT DOCUMENTS

JP        5-315335        11/1993

* cited by examiner

*Primary Examiner*—Jermele M Hollington
(74) *Attorney, Agent, or Firm*—McGinn IP Law Group, PLLC

(57) ABSTRACT

An evaluation pattern for evaluation of lateral hillock formation is provided with a lattice pattern; and an isolated metallization. The lattice pattern includes: a loop interconnection; and lattice interconnections laterally and vertically arranged to intersect with one another so that a region surrounded by the loop interconnection is divided into a plurality of sub-regions arranged in rows and columns. The width of the lattice interconnections is narrower than the width of the loop interconnection. The isolated metallization is provided in an outmost one of the sub-regions, the outmost one being surrounded by the loop interconnection and corresponding ones of the lattice interconnections.

13 Claims, 6 Drawing Sheets

EVALUATION PATTERN SUITABLE FOR EVALUATION OF LATERAL HILLOCK FORMATION

INCORPORATION BY REFERENCE

This application claims the benefit of priority based on Japanese Patent Application No. 2007-249246, filed on Sep. 26, 2007, the disclosure of which is incorporated herein by reference.

BACKGROUND OF THE INVENTION

1. Field of the Invention

The present invention relates to an evaluation pattern and method for evaluation of lateral hillocks formed on metal interconnections.

2. Description of the Related Art

As known in the art, metal interconnections, typically formed of aluminum or aluminum alloy, often suffer from unintended formation of protrusions called "hillocks" which is caused by abnormal metal crystal growth due to the thermally-induced stress resulting from annealing processes performed after the deposition and patterning of the metal interconnections in the manufacture. Especially, lateral hillocks growing in the direction along the substrate surface, which are likely to formed on the sides of wide metal interconnections, may cause short-circuiting between adjacent interconnections; the size of a large lateral hillock may reach 1 µm or more, which is significant in view of the interconnection spacing of recent integration circuits.

Japanese Laid Open Patent Application No. JP-A-Heisei, 1-234567 discloses an interconnection pattern for addressing the short-circuiting caused by lateral hillock formation. FIG. 5 shows the disclosed interconnection pattern. It should be noted that FIG. 5 is a plan view of the disclosed interconnection pattern.

As shown in FIG. 5, the conventional interconnection pattern 1 includes a wide interconnection 2 (with a width of 10 µm or more, for example), and narrow interconnections 3 (with a width less than 10 µm, for example) separately provided along the sides of the wide interconnections 2. The narrow interconnections 3 are almost free from the lateral hillock due to the narrow width thereof.

The interconnection pattern 1 effectively resolves the short-circuiting potentially caused by the lateral hillocks; there is no problem even if a hillock 4 grows from the side of the wide interconnection 2 to be in contact with the narrow interconnections 3, since the voltage levels of the narrow interconnections 3 are identical to that of the wide interconnection 2. It should be noted that neighboring interconnections 5 are also free from lateral hillocks, since the neighboring interconnections 5 are opposed to the narrow interconnections 3 instead of the wide interconnection 2; the narrow width of the narrow interconnections 3 effectively suppresses the lateral hillock formation on the neighboring interconnections 5.

Although the conventional interconnection pattern 1 effectively addresses the problem of short-circuiting between adjacent interconnections caused by the lateral hillocks, the interconnection pattern 1 is not suitable of manufacturing process evaluation from the viewpoint of lateral hillock formation. The above-mentioned interconnection pattern 1, which is not structured to promote the formation of lateral hillocks, does not provide a sufficient number of lateral hillocks for manufacturing process evaluation in light of the usual lateral hillock formation frequency.

The conventional process evaluation in connection with the lateral hillock formation, which involves manually observing a small number of lateral hillocks with an optical microscope and so on, also suffers from poor efficiency, taking a long time for hillock formation evaluation.

SUMMARY

From intensive observations of interconnection patterns on which a relatively increased number of lateral hillocks are formed, the inventor has reached findings described in the following:

(1) As shown in FIG. 6A, lateral hillocks 4 are likely to be formed on an interconnection pattern which incorporates wide interconnections 2 connected through another interconnection 3. The lateral hillock formation shown in FIG. 6A may result from the fact that the connection through the interconnection 3a enhances the thermally-induced stress exerted on the wide interconnections 2 caused by annealing processes.

(2) As shown in FIG. 6B, lateral hillocks are likely to be formed in the inner corner of an angled wide interconnection 2.

The present invention is based on the above-described finding, and addresses the provision of an evaluation pattern suitable for evaluation of lateral hillock formation.

In an aspect of the present invention, an evaluation pattern for evaluation of lateral hillock formation is provided with a lattice pattern; and an isolated metallization. The lattice pattern includes: a loop interconnection; and lattice interconnections laterally and vertically arranged to intersect with one another so that a region surrounded by the loop interconnection is divided into a plurality of sub-regions arranged in rows and columns. The width of the lattice interconnections is narrower than the width of the loop interconnection. The isolated metallization is provided in an outmost one of the sub-regions, the outmost one being surrounded by the loop interconnection and corresponding ones of the lattice interconnections.

In another aspect of the present invention, a substrate structure is provided with a substrate, and at least one evaluation pattern described above. The metallization structure(s) may be formed on a portion of the substrate, or on the entire of the substrate. The substrate may be a semiconductor substrate, glass substrate or ceramic substrate.

In still another aspect of the present invention, an evaluation method includes: providing the above-described evaluation pattern, applying a voltage between the loop interconnection and the isolated metallization, and detecting electric conduction between the loop interconnection and the isolated metallization to detect lateral hillock formation.

BRIEF DESCRIPTION OF THE DRAWINGS

The above and other objects, advantages and features of the present invention will be more apparent from the following description of certain preferred embodiments taken in conjunction with the accompanying drawings, in which.

DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Figure 1:
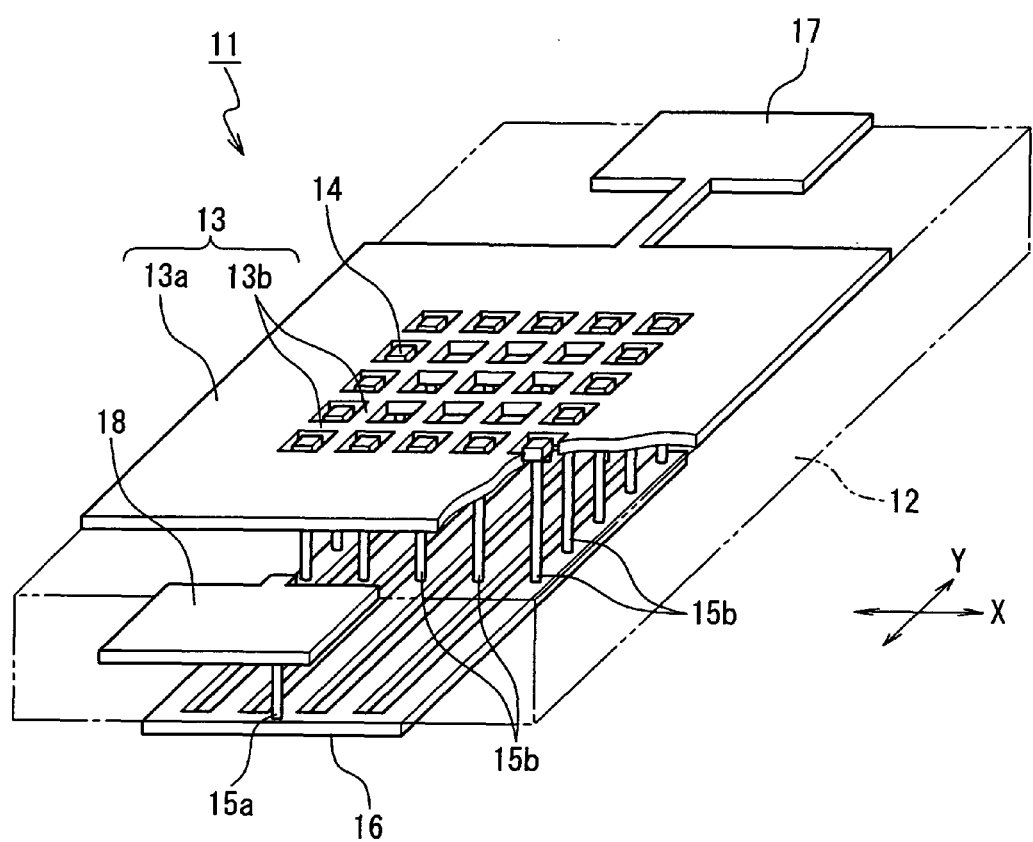
FIG. 1 is a perspective view illustrating an exemplary structure of an evaluation pattern for lateral hillock formation evaluation in one embodiment of the present invention.
Figure 2:
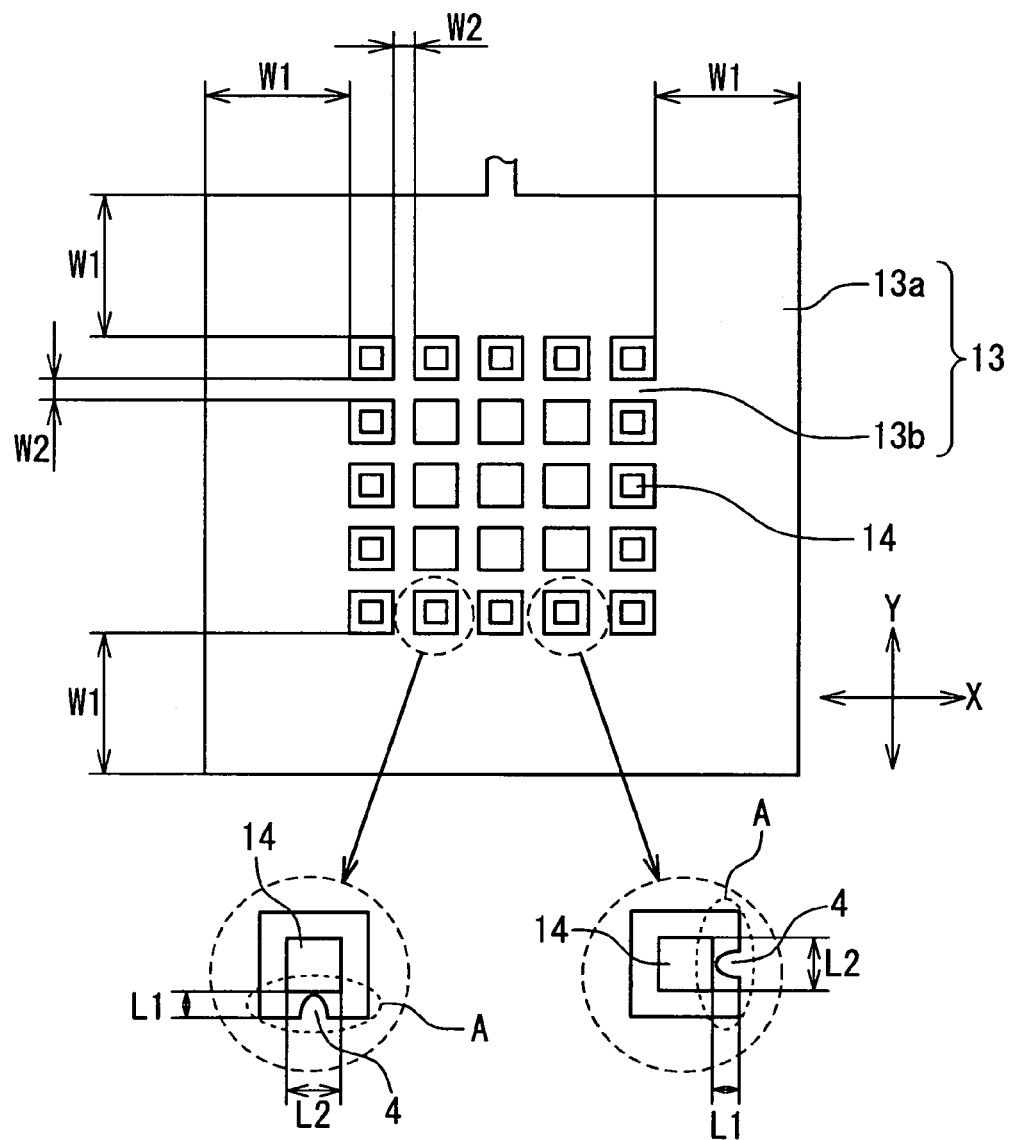
FIG. 2 is a plan view illustrating the structure of the evaluation pattern shown in FIG. 1.

FIGS. 1 and 2 illustrate an exemplary structure of an evaluation pattern used for evaluation of lateral hillock formation in one embodiment of the present invention.

As shown in FIG. 1, an evaluation pattern 11 is provided with a lattice pattern 13 formed on an upper face of a dielectric film 12, which is indicated by dot-and-dashed lines in FIG. 1. The lattice pattern 13 includes a loop interconnection 13a and lattice interconnections 13b horizontally and vertically arranged to intersect with one another so that the region surrounded by the loop interconnection 13a is divided into a plurality of sub-regions. In one embodiment, the shape of the loop interconnection 13a is rectangular or square. The loop interconnection 13 has a wider width, while the lattice interconnections 13b have a narrower width. In this embodiment, the loop interconnection 13a and the lattice interconnections 13b forms 25 sub-regions arranged in five rows and five columns.

In the respective outmost sub-regions, which are positioned between by the loop interconnection 13a and the lattice interconnections 13b opposed to the loop interconnection 13a, isolated metallizations 14 are provided spaced apart from the loop interconnection 13a across spacings with a predetermined width. The opposing portions A of the loop interconnection 13a and the isolated metallizations 14 (indicated by the dashed ellipsoids in FIG. 2) are used to detect formation of lateral hillocks 4.

In one embodiment, the lattice pattern 13 and the isolated metallizations 14 are formed of aluminum or aluminum alloy.

The lattice pattern 13, which are structured to incorporate wide interconnections (corresponding to the loop interconnection 13a) connected through another interconnection (corresponding to the lattice interconnections 13b), is likely to experience the formation of lateral hillocks 4 in accordance with the above-described finding (1).

In addition, the lattice pattern 13, which incorporates four corners of angled wide interconnections formed by the rectangular (or square) loop interconnection 13a, is likely to experience the formation of lateral hillocks 4 in accordance with the above-described finding (2).

The rectangular (or square) structure of the loop interconnection 13a, in which two pairs of opposed interconnections with a wide width are arranged to orthogonally intersect one another, is advantageous for allowing detection of lateral hillocks 4 protruding in any of the X and Y directions in FIG. 2.

When the shape of the loop interconnection 13a of the lattice pattern 13 is square, the lattice pattern 13 is preferably structured so that the number of the columns of the sub-regions defined by the loop interconnection 13a and the lattice interconnections 13b is equal to the number of the rows, and that the planar shape of the lattice pattern 13 has two lines of symmetry, one of which is in the X direction, and the other is in the Y direction. Such structure advantageously results in that the sum of the facing lengths L2 between the loop interconnection 13a and the isolated metallizations 14 with respect to the X-direction is equal to the sum of the facing lengths between the loop interconnection 13a and the isolated metallizations 14 with respect to the Y-direction, providing equivalent hillock detection regions for the respective X- and Y-directions.

The evaluation pattern 11 shown in FIG. 1 further includes first and second electrode pads 17 and 18. As described later, the first and second electrode pads 17 and 18 are used for electrical detect of the lateral hillock formation. The first electrode pad 17 is formed on the upper face of the dielectric film 12 and connected to the loop interconnection 13a. The second electrode pad 18 is connected to a common interconnection 16 formed beneath the bottom face of the dielectric film 12 through a via contact 15a. The common interconnection 16 is connected to the respective isolated metallizations 14 through via contacts 15b. That is, the common interconnection 16 is opposed to the loop interconnection 13a, the lattice interconnections 13b, the isolated metallizations 14, the first and second electrode pads 17 and 18 across the dielectric film 12. In one embodiment, the common interconnection 16 may be formed of aluminum or aluminum alloy, and the via contacts 15a and 15b may be formed of tungsten. It should be noted that the via contacts 15a and 15b and the common interconnection 16 may be formed of other conductive materials.

A description is given of preferred dimensions of the evaluation pattern 11 in the following. Referring to FIG. 2, the width W1 of the loop interconnection 13a is preferably increased up to 10 μm or more to enhance the formation of lateral hillocks 4. The width L1 of the spacing between the loop interconnection 13a and the isolated metallizations 14 preferably ranges from 0.1 to 0.5 μm; this range surely causes the short-circuiting between the loop interconnection 13a and the isolated metallizations 14 when a lateral hillock 4 is formed.

The width W2 of the lattice interconnections 13b preferably ranges from 0.4 to 1.0 μm. In order to enhance the thermally-induced stress, it would be preferable that the width W2 of the lattice interconnections 13b is wide; however, an excessively increased width of the lattice interconnections 13b undesirably reduces the facing lengths L2 between the loop interconnection 13 and the isolated interconnections 14. The above-described preferred range of the width of the lattice interconnections 13b is determined from the viewpoint of both of the enhancement of the thermal-induced stress and the required facing lengths L2 between the loop interconnection 13 and the isolated interconnections 14.

The above-described evaluation pattern 11 is likely to experience lateral hillocks 4, and such feature is preferable for manufacture process evaluation.

Figure 3A:
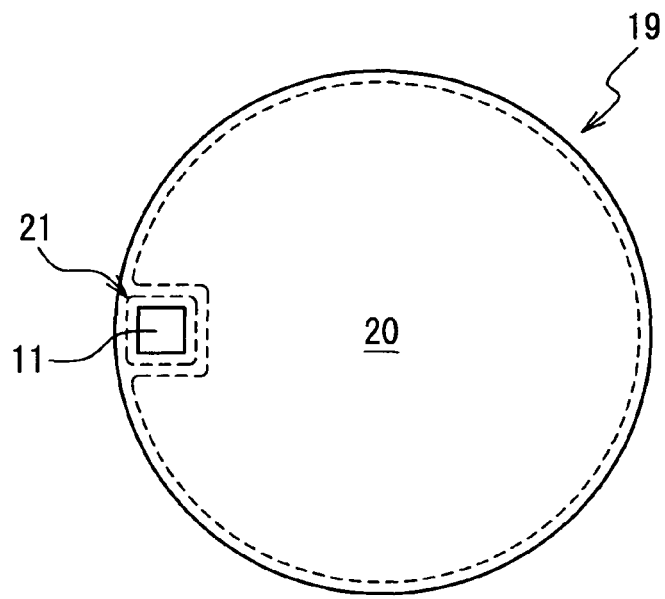
FIG. 3A is a plan view illustrating an exemplary substrate structure provided with an evaluation pattern shown in FIG. 1.
Figure 3B:
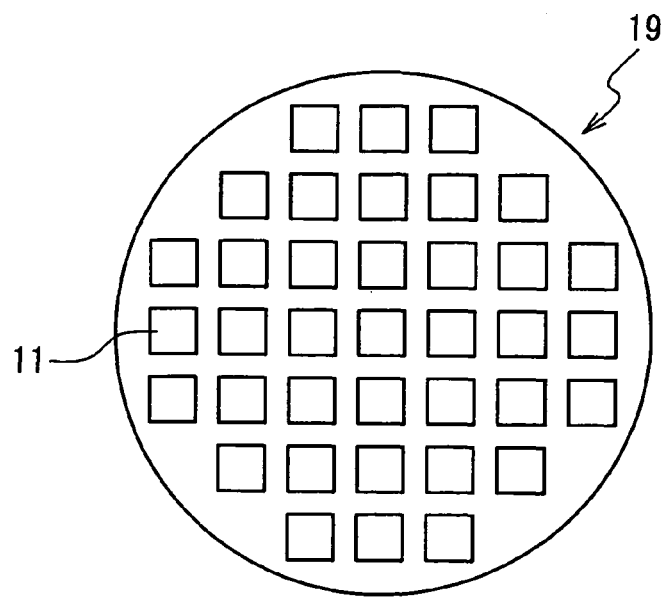
FIG. 3B is a plan view illustrating another exemplary substrate structure provided with a plurality of evaluation patterns shown in FIG. 1.
Figure 4:
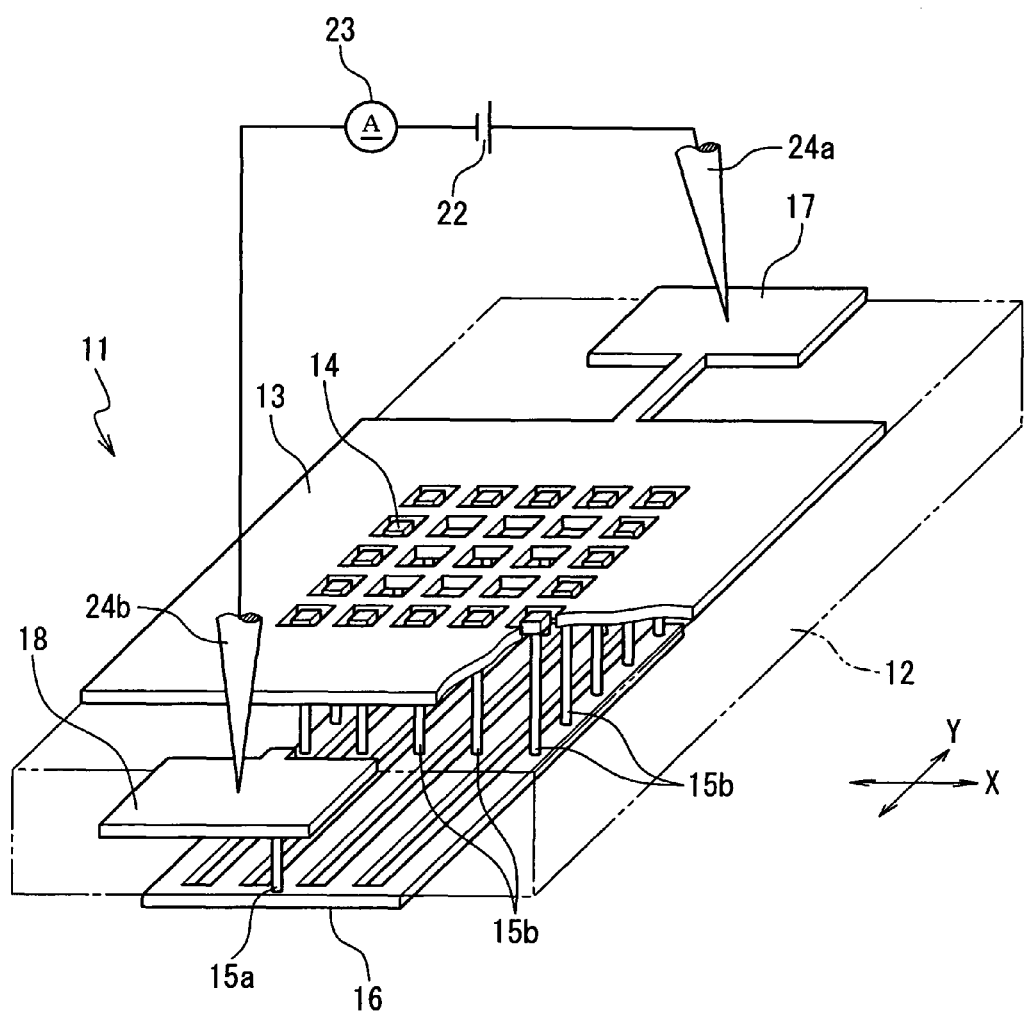
FIG. 4 is a perspective view illustrating the method of detecting lateral hillock formation by using the evaluation pattern shown in FIG. 1.
Figure 5:
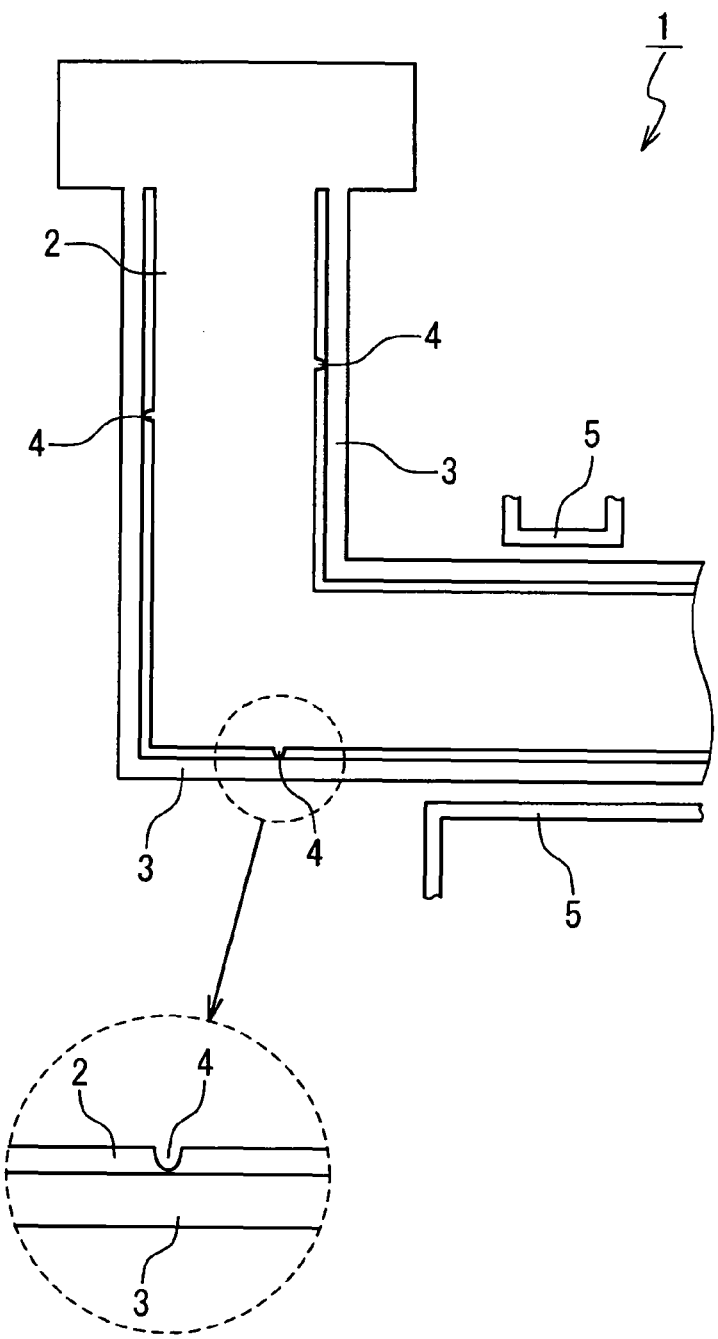
FIG. 5 is a plan view illustrating a conventional interconnection pattern.
Figure 6A:
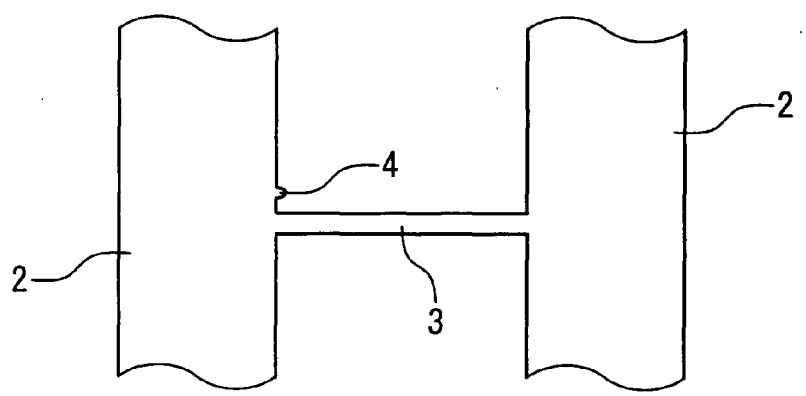
FIGS. 6A and 6B are plan views illustrating interconnection patterns on which lateral hillocks are likely to be formed.
Figure 6B:
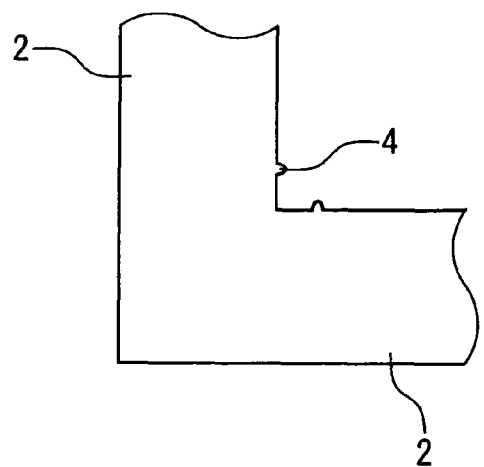

As shown in FIG. 3A, the evaluation pattern 11 may be formed in an evaluation area 21 which is a portion of a semiconductor substrate 19 prepared separately from a product integration area 20 within which product integrated circuits are formed. Alternatively, as shown in FIG. 3B, a plurality of evaluation patterns 11 are prepared over the entire of the semiconductor substrate 19. Such substrate can be used as a substrate dedicated for process evaluation. Other substrates, such as glass substrates and ceramic substrates, may be used in place of the semiconductor substrate 19.

Detection of the lateral hillock formation with the evaluation pattern 11 may be achieved through an electrical method. More specifically, test probes 24a and 24b between which a dc power supply 22 and an ammeter 23 are connected are probed on the first and second electrode pads 17 and 18, respectively, and a predetermined voltage is applied between the loop interconnection 13a and the isolated metallizations 14 through the first and second electrode pads 17 and 18. The electrical conduction between the loop interconnection 13a and the isolated metallizations 14 is detected on the basis of the current value of the ammeter 23 to detect the formation of lateral hillocks 4.

Specifically, when short-circuiting caused by lateral hillocks 4 does not occur between the loop interconnection 13a and the isolated metallizations 14, no electric conduction is established. When short-circuiting due to the lateral hillocks occurs, on the other hand, electric conduction is established between the loop interconnection 13a and the isolated metallizations 14.

Such electrical method allows detection of lateral hillocks 4 more efficiently than the observation using an optical microscope.

It is apparent that the present invention is not limited to the above embodiments, but may be modified and changed without departing from the scope of the invention. For example, although the sub-regions defined by the loop interconnection 13a and the lattice interconnections 13b are arranged in five rows and five columns in the above-described embodiment, the skilled person would recognize that the numbers of the rows and columns of the sub-regions are not limited to five. Although the isolated metallizations 14 are described as being square in the above-described embodiment, the isolated metallizations 14 may be rectangular.

What is claimed is:

1. An evaluation pattern for evaluation of lateral hillock formation, comprising:
   a lattice pattern; and
   an isolated metallization,
   wherein said lattice pattern includes:
   a loop interconnection; and
   lattice interconnections laterally and vertically arranged to intersect with one another so that a region surrounded by the loop interconnection is divided into a plurality of sub-regions arranged in rows and columns, wherein a width of said lattice interconnections is narrower than a width of said loop interconnection, and
   wherein said isolated metallization is provided in an outmost one of said sub-regions, said outmost one being surrounded by said loop interconnection and corresponding ones of the lattice interconnections.

2. The evaluation pattern according to claim 1, wherein said isolated metallization is opposed to said loop interconnection across a spacing.

3. The evaluation pattern according to claim 1, wherein said isolated metallization is provided within each of all the outmost ones of said sub-regions.

4. The evaluation pattern according to claim 1, wherein said loop-interconnection is electrically connected to a first electrode pad, and
   wherein said isolated metallization is electrically connected to a second electrode pad.

5. The evaluation pattern according to claim 4, further comprising a common interconnection,
   wherein said loop interconnection, said lattice interconnections, said isolated metallization and said first and second electrode pads are formed on an upper face of a dielectric film, and
   wherein said common interconnection is formed beneath a bottom face of said dielectric film, connected to said isolated metallization through a first via contact formed through said dielectric film, and further connected to said second electrode pad through a second via contact formed through said dielectric film.

6. The evaluation pattern according to claim 1, wherein said width of said loop interconnections is 10 μm or more.

7. The evaluation pattern according to claim 1, wherein said width of said lattice interconnections ranges from 0.4 to 1.0 μm.

8. The evaluation pattern according to claim 1, wherein a width of spacing between said loop interconnection and said isolated metallization ranges from 0.1 to 0.5 μm.

9. The evaluation pattern according to claim 1, wherein a planar shape of said loop interconnection is square.

10. The evaluation pattern according to claim 9, wherein a number of rows of said sub-regions is equal to a number of columns of said sub-regions, and
    wherein a planar shape of said lattice pattern has two line of symmetry which are orthogonal to each other.

11. The evaluation pattern according to claim 1, wherein said loop interconnection, said lattice interconnections, and said isolated metallization are formed of aluminum or aluminum alloy.

12. A substrate structure comprising:
    a substrate; and
    at least one evaluation pattern comprising a lattice pattern and an isolated metallization,
    wherein said lattice pattern includes:
    a loop interconnection;
    lattice interconnections laterally and vertically arranged to intersect with one another so that a region surrounded by the loop interconnection is divided into a plurality of sub-regions arranged in rows and columns, wherein a width of said lattice interconnections are narrower than a width of said loop interconnection, and
    wherein said isolated metallization is provided in an outmost one of said sub-regions, said outmost one being surrounded by said loop interconnection and corresponding ones of the lattice interconnections.

13. A method of evaluation of lateral hillock formation, comprising:
    providing an evaluation pattern comprising a lattice pattern and an isolated metallization, wherein said lattice pattern includes:
    a loop interconnection;
    lattice interconnections laterally and vertically arranged to intersect with one another so that a region surrounded by the loop interconnection is divided into a plurality of sub-regions arranged in rows and columns, and
    wherein a width of said lattice interconnections are narrower than a width of said loop interconnection, and
    wherein said isolated metallization is provided in an outmost one of said sub-regions, said outmost one being surrounded by said loop interconnection and corresponding ones of the lattice interconnections;
    applying a voltage between said loop interconnection and said isolated metallization; and
    detecting electrical conduction between said loop interconnection and said isolated metallization.

* * * * *